United States Patent [19]  [11] 4,174,491
Nakamura et al.  [45] Nov. 13, 1979

[54] MOUNT FOR A LIGHT EMITTING DEVICE

[75] Inventors: Satoshi Nakamura, Hachioji; Ichiro Ikushima, Kokubunji; Yoshimitsu Sasaki, Tokyo; Katuaki Chiba, Kokubunji; Ryoichi Ito, Hachioji, all of Japan

[73] Assignee: Hitachi, Ltd., Japan

[21] Appl. No.: 918,275

[22] Filed: Jun. 22, 1978

[30] Foreign Application Priority Data

Jul. 8, 1977 [JP] Japan .................................. 52-80961

[51] Int. Cl.² ..................... H01L 33/00; H05B 33/04; H01S 3/00
[52] U.S. Cl. .................................... 313/499; 313/111; 313/512
[58] Field of Search ................. 313/499, 512, 111, 110

[56] References Cited
U.S. PATENT DOCUMENTS 3,303,432  2/1967  Garfinkel et al. ............... 313/499 X
4,013,916  3/1977  Brown ............................. 313/499 X Primary Examiner—Palmer C. Demeo
Attorney, Agent, or Firm—Craig and Antonelli

[57] ABSTRACT

A mount for a light emitting device, which includes a first silicon substrate provided with first holding grooves of trapezoidal cross-section for mounting optical parts arranged in the vicinity of the light emitting plane of a light emitting element and a positioning groove for the light emitting element on the surface thereof, a second silicon substrate provided with second holding grooves having a trapezoidal cross-section similar to that of the first grooves for holding the optical parts and a hole portion for inserting the light emitting element, and a covering member for air tightly covering the hole portion, whereby the optical parts and the light emitting element of the light emitting device are tightly sealed by the above-stated means. The first and second holding grooves have the silicon crystal plane of (111) as both the side surfaces of their trapezoidal cross sections, and extend in the silicon crystal orientation of <110>.

15 Claims, 12 Drawing Figures

FIG. 1A
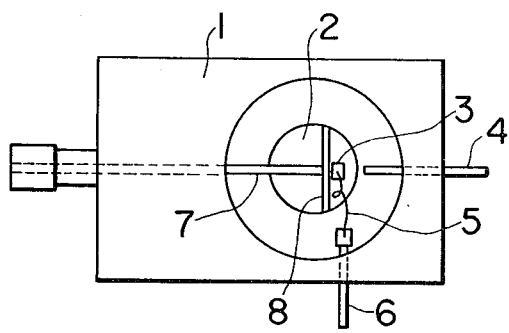
FIG. 1B
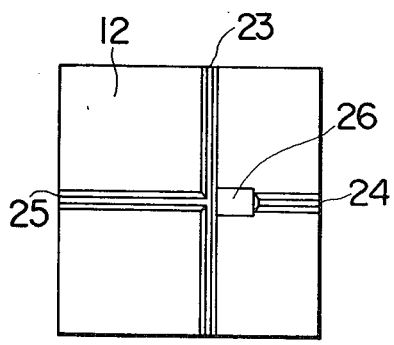
FIG. 2A
FIG. 2B
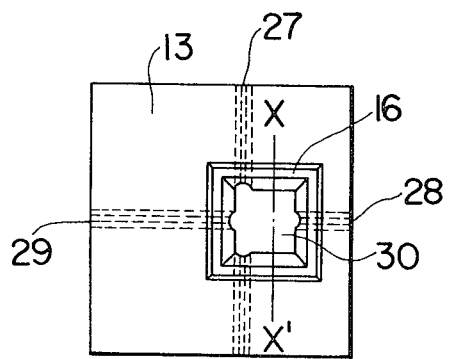

MOUNT FOR A LIGHT EMITTING DEVICE

BACKGROUND OF THE INVENTION

This invention relates to a mount for a light emitting device wherein light radiated from a light emitting element such as a semiconductor laser or a high intensity light emitting diode is introduced into an optical waveguide such as optical fiber at a high efficiency and is used for communication or for any other purpose.

In recent years, researches have been made on systems in which the optical communication is conducted by employing a semiconductor laser, a high intensity light emitting diode or the like as a light source and laying optical fibers instead of electric wires.

FIGS. 1A and 1B illustrate an example of a light source portion in an optical communication system of this type. FIG. 1A is a plan view, while FIG. 1B is a partial bird's-eye view.

The illustrated structure is such that a light emitting element 3 such as semiconductor laser and high intensity light emitting diode, an optical fiber for signals 7 which receives and propagates light radiated from the light emitting element 3, a cylindrical lens 8 which introduces the light radiated from the light emitting element 3 into the optical fiber 7 at a high efficiency, an optical fiber 4 for monitoring the operating state of the light emitting element 3, etc. are integrally assembled in an airtightly sealed case 1.

Accordingly, the airtight case 1 in the prior art is comparatively large in size as shown in FIG. 1A. This inevitably makes a lead wire 5 as well as a current injection terminal 6 long. The inductance of the lead wire therefore becomes high, and the high inductance is sometimes inconvenient for modulating the light emitting element at a high frequency. The large size of the case 1 is disadvantageous in the production cost, handling, etc.

Further, as seen from FIG. 1B, the signal optical fiber 7 and the cylindrical lens 8 are merely bonded to a mount 2 with indium (In) solder. The adhesiveness of the bonding is low and lacks in reliability.

SUMMARY OF THE INVENTION

This invention has been made in view of the afore-cited problems. It has for its object to make small in size and light in weight an airtightly sealed case for a light emitting element for a light source of optical communication etc., thereby to reduce the inductance of a lead wire as well as a current injection terminal and to facilitate the high frequency modulation of the element; to firmly bond a signal optical fiber and a cylindrical lens to a mount for a light emitting device, thereby to enhance the reliability; and to fabricate the case at low cost.

In order to accomplish the object, this invention provides a mount comprising a mount substrate made of a silicon substrate which is provided in its surface with holding grooves of trapezoidal cross section for holding optical parts in the vicinity of the light emitting plane of a light emitting element, the holding grooves having the silicon crystal plane of (111) as both side surfaces of their trapezoidal cross section and being formed in the silicon crystal orientation of <110>, and a positioning groove for locating the light emitting element to a predetermined position; a keeper substrate made of a silicon substrate which is provided with keeping-down grooves formed in positions corresponding to the holding grooves of the mount substrate and having a trapezoidal cross section similar to that of the holding grooves, and a hole portion capable of snugly inserting therein the light emitting element to be located by the positioning groove; and a covering member which can airtightly cover the hole portion; the optical parts etc. being sandwiched in between the mount substrate and the keeper substrate and held integrally and airtightly.

BRIEF DESCRIPTION OF THE DRAWING

FIGS. 1A and 1B are a plan view and a partial bird's-eye view showing a prior-art mount for a light emitting device, respectively.

FIGS. 2A and 2B are views showing a partial construction of a mount for a light emitting device according to this invention, respectively.

DETAILED DESCRIPTION OF THE INVENTION

Now, this invention will be described in detail with reference to embodiments.

An oxide film is formed on the crystal plane (100) of a silicon substrate, a window with its one latus extending in the crystal orientation <110> is provided in the oxide film by photolithography, and using the oxide film as a mask, the silicon substrate is etched with an aqueous solution of caustic soda. Then, owing to the crystal plane indices-dependency of the etching rate, the form of the etched groove becomes trapezoidal, and the crystal plane (111) appears on the side walls of the groove. Accordingly, the angle defined between the side surface and the upper surface of the groove is always constant. The etching rate of the crystal plane (111) is only about 1/100 of that of the crystal plane (100). Therefore, even when the depth of the groove is made about 100 $\mu$m, the substrate is etched only approximately 1 $\mu$m in the direction parallel to the surface thereof. Accordingly, if the width of the window of the etching mask formed by the photolithography can be made precise, the shape of the groove becomes fixed irrespective of conditions of the etching, and the dispersion of the dimensions of the groove can be suppressed to 1-2 $\mu$m or less.

Figure 3:
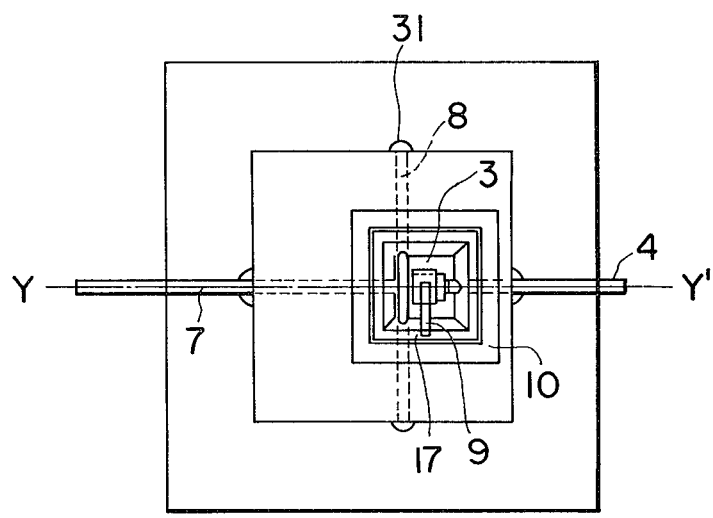
FIG. 3 is a plan view for explaining the general construction of an embodiment of this invention.
Figure 4:
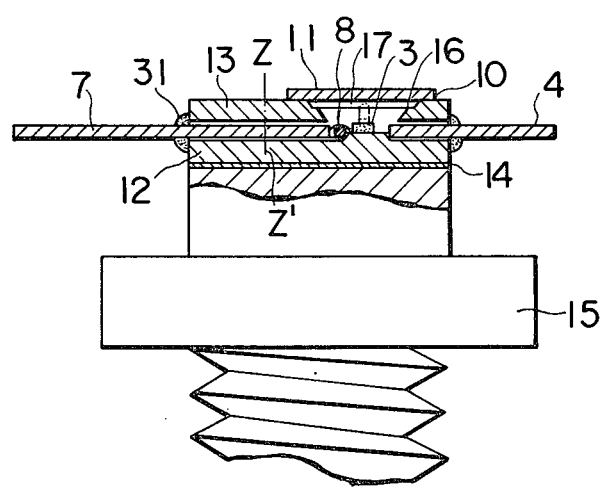
FIG. 4 is a partial sectional view taken along plane Y-Y' in FIG. 3.
Figure 5:
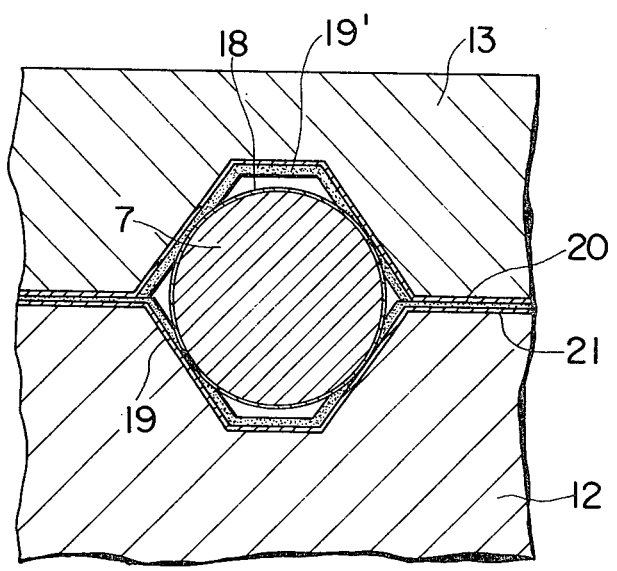
FIG. 5 is a partial sectional view taken along plane Z-Z' in FIG. 4.
Figure 6:
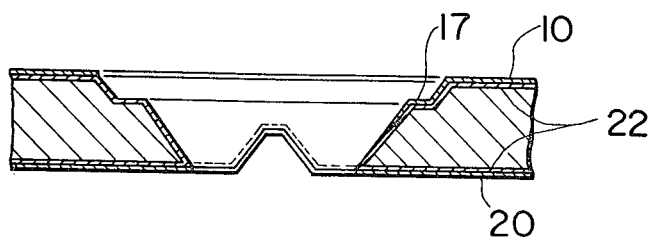
FIG. 6 is a partial sectional view taken along plane X-X' in FIG. 2B.

FIGS. 2A through 6 are views for explaining an embodiment of this invention. FIG. 2A shows a state in which holding grooves for an optical fiber etc. are formed in a mount substrate, and FIG. 2B a state in which keeping-down grooves for the optical fiber etc. are formed in a keeper substrate. FIGS. 3 and 4 show a state in which the whole device is assembled. FIG. 5 is an enlarged sectional view of a situation in which the optical fiber is held in a mount. FIG. 6 is an explanatory view of an insulator film which is formed on the surface of the keeper substrate.

Hereunder, this invention will be described with reference to these figures.

As illustrated in FIG. 2A, a holding groove 25 for an optical fiber for signals, a holding groove 24 for an optical fiber for monitoring and a holding groove 23 for a cylindrical lens are simultaneously formed in the upper surface of a silicon substrate 12 by the first photolithography and the subsequent etching with an aqueous solution of caustic soda. In case where the diameter of the optical fiber for signals is 130 μm, the depth of each groove is adjusted to approximately 70 μm. Thereafter, a groove 26 for positioning a semiconductor laser is formed by the second photolithography and the subsequent etching with an aqueous solution of caustic soda. Then, the formation of the various grooves in the mount substrate 12 is completed.

A keeper substrate serves to keep the cylindrical lens and the optical fibers down. As illustrated in FIG. 2B, a keeping-down groove 29 for the signal optical fiber, a keeping-down groove 28 for the monitoring optical fiber and a keeping-down groove 27 for the cylindrical lens are formed in the lower surface of the keeper substrate 13 and in positions corresponding to the respective holding grooves of the mount substrate 12 by the same method as that for the formation of the holding grooves. The center line of each optical fiber must coincide with the position of a radiation layer of the semiconductor laser. In order to meet this requirement, the position of the center line needs to be adjusted so as to lie somewhat (several μm or so) above the surface of the mount as seen from FIG. 5. Accordingly, in order to press the optical fibers etc. down into the holding grooves by the keeping-down grooves and to bring the keeper substrate 13 and the mount substrate 12 into close contact, it is actually necessary to make the width of each keeping-down groove somewhat greater than that of the corresponding holding groove. After forming the respective keeping-down grooves, a groove 16 is formed in the upper surface of the substrate 13, and a hole 30 penetratingly extending from the upper surface to the lower surface is formed.

After forming the respective grooves as described above, a chromium (Cr) - gold (Au) double-layer film 21 and an indium (In) solder layer 19 are formed on the upper surface, the lower surface and the side surfaces of the mount substrate 12 by evaporation as shown in FIG. 5. Likewise, a Cr - Au double-layer film 20 and an In solder layer 19' are formed on the lower surface of the keeper substrate 13. Electrodes 10 and 17 of Cr - Au double-layer films are formed on the upper surface of the keeper substrate 13. The electrodes 10 and 17 are electrically connected.

Since the mount substrate 12 is the path of a current to the semiconductor laser, a substrate of low specific resistance is selected. On the other hand, the keeper substrate 13 for keeping the cylindrical lens etc. down needs to function so as to insulate the electrodes of the semiconductor laser on the positive and negative sides, and a substrate of high specific resistance is selected. In order to make the insulation more satisfactory, it is advantageous to form an insulating film of glass or the like 22 on the substrate surface as illustrated in FIG. 6.

After forming the respective metallic layers by the evaporation, the semiconductor laser 3, signal optical fiber 7, monitoring optical fiber 4 and cylindrical lens 8 are placed on the mount substrate 12 and have the keeper substrate 13 put thereon in an arrangement as illustrated in FIGS. 3 and 4. Under this state, the resultant structure is heated to 200° C. in a stream of $H_2$ gas. Then, both the substrates are welded by the In solder.

The surfaces of the optical fibers etc. are metallized by Cr - Au evaporated films 18, and the films are alloyed with the In solder, so that the optical fibers etc. are firmly bonded with the mount substrate 12 and the keeper substrate 13. Thereafter, the upper side electrode of the semiconductor laser 3 and the electrode 17 on the upper surface of the keeper substrate 13 are connected by a lead wire such as Au wire and Au ribbon 9. Subsequently, a covering member 11 the surface of which is formed with In solder, indium (In) - tin (Sn) alloy solder or the like is welded to the electrode 10 in an inert gas such as $N_2$.

Owing to the groove 16 formed to be lower than the surface, the covering member 11 is enabled to airtightly adhere to the keeper substrate 13. The covering member 11 functions also as the electrode of the semiconductor laser on the positive or negative side. In order to maintain the semiconductor laser airtight, the interspace between the optical fiber 7 and the mount substrate 12 as shown in FIG. 5 is filled up with a low fusing point-solder 31. The mount substrate 12 is bonded to a heat sink 15 by In - Sn solder 14.

The mount which is thus fabricated can be put into a size of about 2–3 mm square. Simultaneously therewith, the inter-electrode capacitances and the inductances of the lead wires can be reduced as compared with those in the prior art.

In some products, it is useful to employ mounts for light emitting devices in aspects to be stated below.

Figure 7:
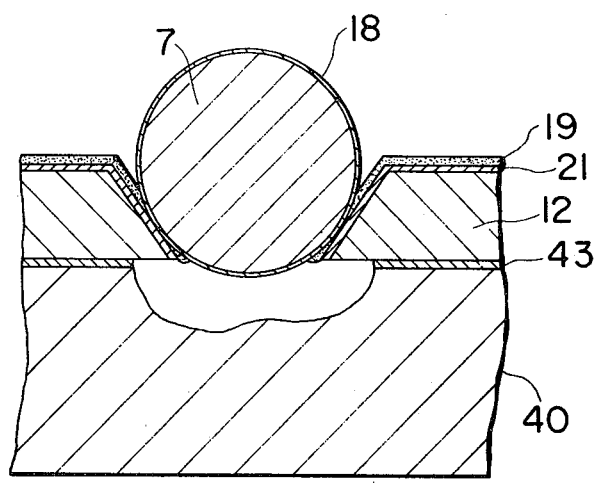
FIGS. 7, 8, and 9A and 9B are views for explaining further embodiments of this invention.

FIG. 7 shows another embodiment of the mount for a light emitting device according to this invention.

It is well known that, in general, the characteristics of light emitting elements, especially a semiconductor laser are susceptible to temperatures. It is accordingly desirable that the temperature rise of the element to be caused by electric power supplied to the element is suppressed to the utmost. In other words, the thermal resistance of the mount for the element must be made as low as possible.

The thermal conductivity of silicon (Si) is 1.5 (W/cm.°C.), whereas that of gold (Au) is 3.11, that of silver (Ag) is 4.18 and that of copper (Cu) is 4.0. It is accordingly advantageous for heat radiation to build up a two-layered (multilayer) structure made up of silicon and one metal of high thermal conductivity, for example, any of the above-mentioned metals, and to make the silicon as thin as possible. In this regard, however, when the thickness of the silicon layer 12 is not greater than approximately the radius of the optical fiber 7, the holding grooves penetratingly extend down to the rear surface of the silicon layer, and the lower surfaces of the cylindrical lens etc. abut upon the surface of the exposed metal layer. Therefore, it is further necessary to etch the metal layer after forming the grooves in the silicon layer. In that case, a solution which does not etch silicon, such as aqua regia, needs to be employed as an etchant. The thickness of the silicon layer cannot be made less than a thickness including parts at which the peripheral portions of the cylindrical lens etc. and the side walls of the grooves contact. The thickness of the metal layer 40 may be selected to approximately 100–200 μm by taking into account the conditions of mechanical strength, convenient handling, sufficiently low thermal resistance, etc.

The actual process for manufacture is performed according to procedures described below. First of all, a silicon substrate 12 which has a thickness fulfilling the aforecited requirements and the surface of which is the crystal plane (100) is prepared. A Cr - Au double-layer film 43 is formed on the rear surface of the silicon substrate by evaporation, whereupon a metal layer 40 of e.g. Au, Ag or Cu is formed on the evaporated film by plating. For the metal layer, in general, any metal higher in the thermal conductivity than silicon is effective, but the above-mentioned metals are easily used. Subsequently, uneven parts in the surface of the plating layer are flattened by lapping. Thereafter, grooves 23, 24, 25 and 26 are formed in the surface of the silicon substrate, and the metal layer exposed to the bottoms of the grooves is etched down to a proper depth with aqua regia. Subsequently, on the surface of the silicon substrate, an evaporated film 21 of Cr - Au and an evaporated film 19 of In are formed in the order mentioned.

In this way, the semiconductor laser mount is fabricated which can appropriately radiate the generated heat of the semiconductor laser without spoiling the accuracy of finishing of the holding grooves for the cylindrical lens etc.

Figure 8:
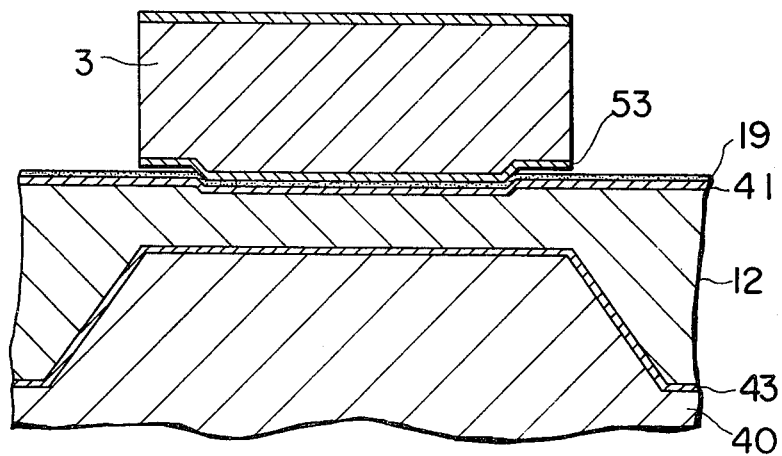

FIG. 8 shows still another embodiment of this invention. Similarly to the second embodiment, this embodiment intends to adequately radiate the generated heat of a semiconductor laser without damaging the accuracy of finishing of holding grooves for a cylindrical lens etc. This embodiment is substantially the same as the second embodiment except that, in the rear surface of a silicon substrate 12, a hole or groove is formed only at a part substantially underneath a groove 26 for positioning a semiconductor laser 3. Numeral 53 designates an Au electrode of the semiconductor element.

Figure 9A:
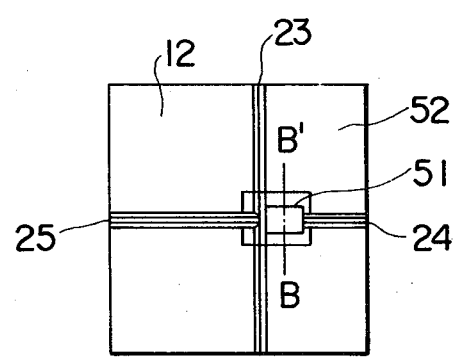
Figure 9B:
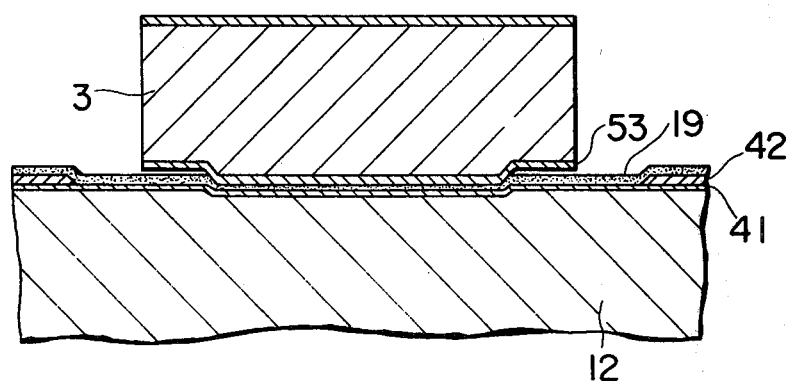

FIG. 9A is a plan view showing yet another embodiment of this invention, while FIG. 9B is a partial sectional view taken along line B-B' in FIG. 9A. As regards the bonding of a semiconductor laser to a mount, it is generally known that when the bonding strength is intense, a great stress develops in the element on account of the difference between the coefficients of thermal expansion of the element and the mount substrate, so the lifetime of the element shortens. In case where an evaporated film on the surface of the element is of Au and where metal layers on the substrate surface on the mount side are evaporated in the order of Cu, Au and In, the element and the mount substrate are firmly welded by an Au - In alloy layer formed therebetween, and hence, a stress acting on the element becomes great. In contrast, it has been found that in case where the evaporated layers on the mount side are formed in the order of Cu and In and where the layer of Au is not evaporated, such a drawback is avoidable. On the other hand, however, a cylindrical lens and optical fibers need to be securely bonded to the mount substrate.

To the end of fulfilling both the contradictory requests, as seen from the figures, a part 51 of the surface of a silicon substrate 12 is formed with two layers including a Cr layer 41 and an In layer 19, while the other part 52 is formed with three evaporated layers including the Cr layer 41, an Au layer 42 and the In layer 19. Thus, the two requirements are simultaneously achieved, and it has become possible to fabricate a semiconductor laser device of high reliability. Even when a layer of a metal making an alloy with In, such as Ag and Ni, is formed instead of the evaporated Au film, a similar effect can be expected.

Although, in the foregoing embodiments, only the semiconductor laser has been referred to as the light emitting element, it is to be understood that the present invention is similarly applicable to light emitting elements as to which comparatively high accuracies are required in the coupling with optical transmission lines, for example, a superluminescent diode, an edge emitting diode, etc.

As set forth above, according to this invention, it becomes possible that the light emitting element for use in optical communication etc. is received in the case having the same size as that of the prior-art mount 2 without spoiling airtightness. Since the length of the lead wire can accordingly be made short, the inductance of the lead wire can be made low, and it becomes possible to operate the light emitting element at frequencies higher than in the prior art. Furthermore, the signal optical fiber 7, monitoring optical fiber 4 and cylindrical lens 8 are held at a high mechanical strength, so that the reliabilities of vibration-resisting property etc. can be made high. By forming the mount by the use of silicon, processing techniques in the semiconductor technology can be utilized, so that the mount can be fabricated in large quantities and at low cost.

We claim:

1. A mount for a light emitting device including a light emitting element and optical parts, which comprises
mount substrate means provided, with one surface having a positioning groove for locating the light emitting element at a predetermined position and holding grooves of trapezoidal cross section for holding the optical parts in the vicinity of a light emitting plane of the light emitting element;
keeper substrate means provided with one surface having keeping-down grooves of trapezoidal cross section formed in positions corresponding to the respective holding grooves of said mount substrate means, to serve to install the optical parts in cooperation with said holding grooves of said mount substrate means, and with a hole penetratingly extending from the one surface thereof to another surface opposite to the one surface, for snugly inserting therein the light emitting element to be located by said positioning groove of said mount substrate means; and
a covering member provided on the other surface of said keeper substrate means, for airtightly covering said hole of said keeper substrate means;
so that said optical parts are sandwiched in between said mount substrate means and said keeper substrate means and integrally held in close contact therewith, and that they can be airtightly sealed together with the light emitting element.

2. A mount for a light emitting device according to claim 1, wherein said mount substrate means is a silicon substrate of low specific resistance, and said holding grooves formed in said one surface of said silicon substrate have a silicon crystal plane of (111) as both side surfaces of said trapezoidal cross section and extend in a silicon crystal orientation of <110>.

3. A mount for a light emitting device according to claim 2, wherein said keeper substrate means is a silicon substrate of high specific resistance, and said keeping-down grooves formed in said silicon substrate have the silicon crystal plane of (111) as both side surfaces of said trapezoidal cross section and extend in the silicon crystal orientation of <110>.

4. A mount for a light emitting device according to claim 2 or 3, wherein a width of said each keeping-down groove formed in said keeper substrate means is made greater than that of said each groove formed in said mount substrate means.

5. A mount for a light emitting device according to claim 2, wherein a Cr-Au double-layer film and an In solder layer are formed on said one surface, another surface opposite to said one surface and side surfaces of said silicon substrate of said mount substrate means, and wherein said mount substrate means is welded with said keeper substrate means through the In solder.

6. A mount for a light emitting device according to claim 5, wherein said keeper substrate means is a silicon substrate and wherein a Cr-Au double-layer film and an In solder layer are formed on said one surface of said keeper substrate means so as to oppose said holding grooves of said mount substrate means, said keeper substrate means being welded with said mount substrate means through the In solder.

7. A mount for a light emitting device according to claim 5, wherein said keeper substrate means is a silicon substrate with an insulating film formed thereon on said one surface, said another surface and side surfaces.

8. A mount for a light emitting device according to claim 7, wherein an electrode portion to be connected with said covering member is disposed on that surface side of said keeper substrate means on which said covering member is installed.

9. A mount for a light emitting device according to claim 8, wherein a Cr - Au double-layer film is formed on said one surface, said another surface and said electrode portion of said silicon substrate of said keeper substrate means.

10. A mount for a light emitting device according to claim 9, wherein said covering member is formed on its surface with one selected from the group consisting of an In solder and an In - Sn alloy solder and is welded to said electrode portion.

11. A mount for a light emitting device according to claim 10, wherein said mount substrate means is bonded to a heat sink through an In - Sn solder.

12. A mount for a light emitting device including a light emitting element and optical parts, which comprises a first silicon substrate of low specific resistance which is provided in one surface thereof with a positioning groove for locating the light emitting element at a predetermined position and with holding grooves of trapezoidal cross section for holding an optical fiber for signals, an optical fiber for monitoring and a cylindrical lens in the vicinity of a light emitting plane of the light emitting element;

a second silicon substrate of high specific resistance which is provided with one surface having keeping-down grooves of trapezoidal cross section formed in positions corresponding to the respective holding grooves of said first silicon substrate, and a hole penetratingly extending from the one surface thereof to another surface opposite to the one surface, for snugly inserting therein the light emitting element to be located by said positioning groove of said first silicon substrate; and a covering member provided on the other surface of said second silicon substrate, for airtightly covering said hole of said second silicon substrate;

so that said optical fiber for signals, said optical fiber for monitoring and said cylindrical lens are sandwiched in between said respective holding grooves of said first silicon substrate and said respective keeping-down grooves of said second silicon substrate and integrally held in close contact therewith, and that they can be airtightly sealed together with said light emitting element.

13. A mount for a light emitting device according to claim 12, wherein said holding grooves formed in said one surface of said first silicon substrate have a silicon crystal plane of (111) as both side surfaces of said trapezoidal cross section and extend in a silicon crystal orientation of <110>.

14. A mount for a light emitting device according to claim 13, wherein said keeping-down grooves formed in said second silicon substrate have the silicon crystal plane of (111) as both side surfaces of said trapezoidal cross section and extend in the silicon crystal orientation of <110>.

15. A mount for a light emitting device according to claim 14, wherein said light emitting element is a semiconductor laser.